US008868250B2

(12) United States Patent
Jensen et al.

(10) Patent No.: US 8,868,250 B2
(45) Date of Patent: Oct. 21, 2014

(54) FAN SPEED CONTROL (75) Inventors: Niels-Peder Mosegaard Jensen, Sunnyvale, CA (US); Joseph Dean Jaoudi, Atlanta, GA (US)

(73) Assignee: Cisco Technology, Inc., San Jose, CA (US)

( * ) Notice: Subject to any disclaimer, the term of this patent is extended or adjusted under 35 U.S.C. 154(b) by 569 days.

(21) Appl. No.: 12/892,522

(22) Filed: Sep. 28, 2010

(65) Prior Publication Data

US 2012/0078420 A1  Mar. 29, 2012

(51) Int. Cl.
| G05D 23/00 | (2006.01) |
| G05B 13/00 | (2006.01) |
| G05B 13/02 | (2006.01) |
| G06F 1/20 | (2006.01) |
| H05K 7/20 | (2006.01) |
| H02B 1/01 | (2006.01) |
| H02B 1/00 | (2006.01) |
| G05B 11/16 | (2006.01) |

(52) U.S. Cl.
CPC .............. *G05B 11/16* (2013.01); *G06F 1/206* (2013.01); *H05K 7/20209* (2013.01)
USPC ............. 700/299; 700/300; 700/275; 700/45; 700/37; 700/40; 700/41; 700/42; 700/43; 700/44; 361/679.46; 361/688; 361/679.47; 361/831; 361/676

(58) Field of Classification Search
USPC ........... 700/299, 275, 300, 45, 37, 40, 41, 42, 700/43, 44; 361/679.46, 688, 679.47, 831, 361/676
See application file for complete search history.

(56) References Cited

U.S. PATENT DOCUMENTS

| 5,040,395 | A | * | 8/1991 | Seki et al. ........................ 72/8.6 |
| 5,157,597 | A | * | 10/1992 | Iwashita ......................... 700/37 |
| 6,003,455 | A |   | 12/1999 | Flamme et al. |
| 7,331,532 | B2 |   | 2/2008 | Currie et al. |
| 8,055,392 | B2 | * | 11/2011 | Kitamura et al. ............. 700/300 |
| 2002/0166517 | A1 |   | 11/2002 | Vogt |
| 2003/0040848 | A1 | * | 2/2003 | Guarracino ................... 700/299 |
| 2003/0120394 | A1 | * | 6/2003 | Ziarnik ......................... 700/300 |
| 2005/0171648 | A1 | * | 8/2005 | Frankel et al. ................ 700/300 |
| 2005/0273208 | A1 | * | 12/2005 | Yazawa et al. ................ 700/299 |
| 2006/0096554 | A1 | * | 5/2006 | Shiozaki .................... 123/41.12 |
| 2006/0108962 | A1 | * | 5/2006 | Murray et al. ................ 318/610 |
| 2006/0151165 | A1 | * | 7/2006 | Poirier .......................... 165/247 |
| 2007/0068762 | A1 | * | 3/2007 | Bhat et al. .................. 192/58.61 |
| 2008/0074010 | A1 |   | 3/2008 | Jungmayr et al. |
| 2009/0217686 | A1 | * | 9/2009 | Bittner ........................... 62/157 |
| 2009/0228148 | A1 |   | 9/2009 | Byquist et al. |
| 2009/0248176 | A1 | * | 10/2009 | El Rifai ......................... 700/45 |
| 2009/0296342 | A1 | * | 12/2009 | Matteson et al. ........ 361/679.46 |

* cited by examiner

*Primary Examiner* — Kavita Padmanabhan
*Assistant Examiner* — Jason Lin
(74) *Attorney, Agent, or Firm* — Brinks Gilson & Lione (57) ABSTRACT In one implementation, an environmental controller operates a cooling system in an electronic device. The environmental controller includes a closed loop control system for operating a cooling fan at a target speed. The environmental controller may select the target speed based on one or more temperature sensors. The environmental controller may select the target speed based on the speeds of additional fans or the fans may be controlled in unison. The closed loop control system includes a proportional weight. When a measured cooling fan speed deviates from the target speed by more than a threshold error value, the proportional weight is constant. As the measured cooling fan speed approaches the target speed, and the threshold error value is crossed, the proportional weight is variable. The variance may be a function of time such as a periodic stair step function.

19 Claims, 6 Drawing Sheets

FAN SPEED CONTROL

FIELD

The present embodiments relate to control of cooling fans.

BACKGROUND

As electronic devices have gotten smaller and faster, the need for cooling systems has increased. Cooling systems may include multiple fans. For example, a computer may have a processor fan, a motherboard fan, a power supply fan, and/or a video card fan. The various cooling fans create noise. Although the amount of noise produced has little impact on the performance of the fan or the system being cooled, noise can negatively affect people nearby. In particular, the noise produced by multiple fans can interact, causing an additive effect, which is a nuisance for the user.

DETAILED DESCRIPTION

Overview

A cooling system includes an environmental controller. The cooling system regulates the temperature inside an electronic device. The electronic device may be a computer, a server, or another network device. The environmental controller includes a control system for operating a cooling fan at a target speed. The target speed may be selected, at least in part, to minimize the sound produced by the fan. In addition, the environmental controller may select the target speed based on one or more temperature sensors or based on the speeds of additional fans. In one implementation, a plurality of fans may be controlled in unison using a predetermined set of target speeds that minimize the sound produced by the fans.

The closed loop control system includes a proportional control. When a measured cooling fan speed is below a threshold speed the proportional control generates the control signal based on a constant. When the measured cooling fan speed is above the threshold speed, the proportion control generates the control signal based on a variable with a varying value. The variable may be a function of time such as a periodic stair step function. Continuous functions may also be used.

In one aspect, a method includes receiving speed data from a fan, comparing the speed data to a threshold speed, selecting a first mode for a control signal if the speed data indicates an actual speed that is less than the threshold speed, wherein the first mode includes a constant weight applied to a difference between a target speed and the actual speed, selecting a second mode for the control signal if the speed data indicates an actual speed is greater than the threshold speed, wherein the second mode includes a dynamic weight applied to the difference between the target speed and the actual speed, wherein the dynamic weight increments from a lower bound to an upper bound, and sending the control signal to the fan.

In a second aspect, an apparatus includes an interface, a memory, and a process. The interface is configured to receive speed data and transmit a control signal. The memory is configured to store a threshold value and a target value. The processor is configured to calculate a difference value between the speed data and the threshold value and generate the control signal based on the difference value and the target value, wherein if the difference value is greater than the threshold value, the control signal includes a constant proportion and if the difference value is less than the threshold value, the control signal includes a varying proportion.

In a third aspect, logic is executable by a processor and operable to calculate an error value as a difference between fan speed data and a target speed, compare the error value to an error threshold, and control fan speed with a constant proportion where the error value is greater than the error threshold and with a dynamic proportion where the error value is less than the error threshold.

EXAMPLE EMBODIMENTS

The noise produced by cooling fans is additive. For example, when the speed of two or more fans operate at nearly the same speed, the fans produce beat frequencies. Beat frequencies having similar but slightly different frequencies and produce periodic variations in volume based on the difference between the two frequencies, which are a nuisance to personnel nearby. Therefore, in cooling systems having multiple fans, it becomes advantageous to control the individual fans at different speeds. Choosing the speeds of the cooling fans depends on various factors including the type of the fan, size of the fan, and location of the fan. One effective method of choosing the speeds of the cooling fans is trial and error.

The selected speeds may be controlled in a feedback loop. A proportional controller is a feedback control loop used to control a fan at a predetermined speed. A proportional controller is any feedback controller where the output is directly proportional to the error signal. The error signal is the difference between the input and the feedback signal. The error signal is multiplied by a constant. The proportional controller has an inherent problem related to the tradeoff between a high constant, which is prone to system instability, and a low constant, which results in a slow step response.

A dynamic proportional controller alleviates this problem. The dynamic proportional controller operates using a default constant until the output reaches a threshold value. When the output meets or exceeds the threshold value, the constant is replaced with a different value. The weight for controlling the rate of speed change varies over time based on the threshold. In one region, the weight may be constant, but in another region, the weight is different, whether constant or varying. In one implementation, the constant may be incremented upwards in time between a lower bound and an upper bound. When the constant reaches the upper bound, the constant returns to the lower bound and repeats incrementing upwards. Alternatively, the constant may increment downwards back to the lower bound after reaching the upper bound. A graph of the dynamic control of the constant may resemble a periodic and repeating stair step function.

Figure 1:
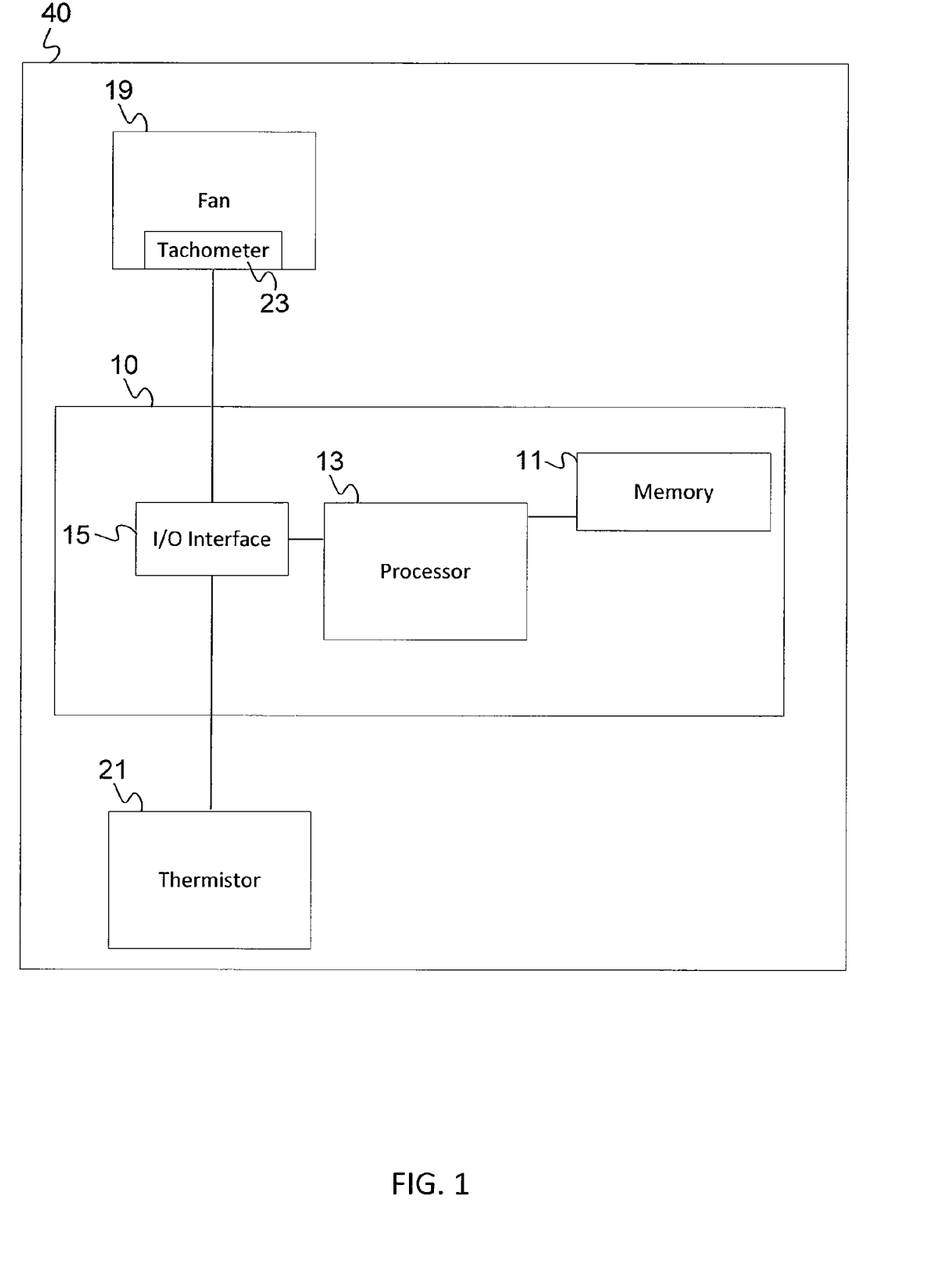
FIG. 1 illustrates an embodiment of a cooling system.

FIG. 1 illustrates an embodiment of a cooling system 40. The cooling system 40 regulates the internal temperature of a computer, a network device, or any device producing heat. The cooling system 40 includes a fan 19, a tachometer 23, and an environmental controller 10. In some implementations, a thermistor 21 may also be included. In place of thermistor 21, any type of temperature sensor may be used. The environmental controller 10 includes a memory 11, a processor 13, and an I/O interface 15.

The environmental controller 10 regulates the operation of the fan 19. The environmental controller 10 may also measure one or more temperatures associated with the cooling system 40, and base the speed or operation of the fan 19 on the measured temperature. The thermistor 21 measures the temperature of the cooling system 40. The thermistor 21 may be located near fan 19. In addition, the environmental controller 10 may monitor installation of one or more components of the cooling system 40, and/or receive user input regarding operation of the cooling system 40.

The fan 19 may be any type of cooling fan, including an axial fan, a curved fan, a cross flow fan, or a blower. In an axial fan, the inflow of air is parallel or collinear with the outflow of air. In a curved fan, the inflow of air is perpendicular or at an angle with the outflow of air. In a cross flow fan, the inflow may be at any angle or parallel with the outflow, and the outflow is spread out to a larger area than the inflow. In a blower or centrifugal blower, the flow of air is created by a rotating cylindrical runner including blades. Centrifugal blowers may include an outlet smaller than the inlet.

The fan 19 may be configured to receive a direct current (DC) input or an alternating current (AC) input. The fan 19 may be a 4-wire pulse width modulated (PWM) fan controlled by a PWM input. An input/output interface of the fan may include a power signal, a ground signal, a control signal, and a sense signal. The fan 19 includes a sensor that detects the rotation of a fan motor and produces the sense signal. The sensor may be a magnetic sensor, such as a Hall sensor. Alternatively, the sensor may be an optical sensor or a mechanical sensor.

The tachometer 23 is configured to measure or detect the speed of the fan 19 from the sense signal. The sense signal may have an amplitude or frequency in proportion to the speed of fan 19. The tachometer 23 may be integrated with the fan, or the tachometer function may be incorporated into the environmental controller 10. The speed of the fan 19 may be measured in revolutions per minute (RPM). Alternatively, the output of the tachometer 23 may also be used to determine whether the fan 19 is rotating.

The control signal, which is an input to fan 19, may be a PWM signal. The PWM signal is a drive signal, in which the relative width of pulses in a train of on-off pulses determines the level of power applied to the fan motor. The control signal may be high frequency, such as 20 kHz or 25 kHz. While the control signal controls the power supplied to the fan motor, the actual power is applied by the power signal. Alternatively, the function of the power signal and the control signal are combined in a 3-wire fan where the entire power to the fan is switched on and off, and the environmental controller 10 directly sets the amplitude of the power signal to control the speed of the fan motor.

The environmental controller 10 includes memory 11, processor 13, and an I/O interface 15. The environmental controller 10 may be implemental with hardware, software, or firmware. The memory 11 may be a volatile memory or a non-volatile memory. The memory 11 may include one or more of a read only memory (ROM), dynamic random access memory (DRAM), a static random access memory (SRAM), a programmable random access memory (PROM), a flash memory, an electronic erasable program read only memory (EEPROM), static random access memory (RAM), or other type of memory. The memory 11 may include an optical, magnetic (hard drive) or any other form of data storage device. The memory 11 may be located in a remote device or removable, such as a secure digital (SD) memory card.

The memory 11 may store computer executable instructions. The processor 13 may execute computer executable instructions. The computer executable instructions may be included in computer code. The computer code may be stored in the memory 11. The computer code may be written in any computer language, such as C++, C#, Java, Pascal, Visual Basic, Perl, HyperText Markup Language (HTML), JavaScript, assembly language, extensible markup language (XML) and any combination thereof. The memory 11 is non-transitory.

The computer code may be logic encoded in one or more tangible media or one or more non-transitory tangible media for execution by the processor 13. Logic encoded in one or more tangible media for execution may be defined as instructions that are executable by the processor 13 and that are provided on the computer-readable storage media, memories, or a combination thereof. Instructions for instructing a network device may be stored on any logic. As used herein, "logic", includes but is not limited to hardware, firmware, software in execution on a machine, and/or combinations of each to perform a function(s) or an action(s), and/or to cause a function or action from another logic, method, and/or system. Logic may include, for example, a software controlled microprocessor, an application specific integrated circuit (ASIC), an analog circuit, a digital circuit, a programmed logic device, and a memory device containing instructions.

The instructions may be stored on any computer readable medium. A computer readable medium may include, but are not limited to, a floppy disk, a hard disk, an ASIC, a compact disk, other optical medium, a random access memory (RAM), a read only memory (ROM), a memory chip or card, a memory stick, and other media from which a computer, a processor or other electronic device can read.

The processor 13 may include a general processor, digital signal processor, ASIC, field programmable gate array, analog circuit, digital circuit, combinations thereof, or other now known or later developed processor. The processor 13 may be a single device or combinations of devices, such as associated with a network or distributed processing. Any of various processing strategies may be used, such as multi-processing, multi-tasking, parallel processing, remote processing, centralized processing or the like. The processor 13 may be responsive to or operable to execute instructions stored as part of software, hardware, integrated circuits, firmware, micro-code or the like. The functions, acts, methods or tasks illustrated in the figures or described herein may be performed by the processor 13 executing instructions stored in the memory 11. The functions, acts, methods or tasks are independent of the particular type of instructions set, storage media, processor or processing strategy and may be performed by software, hardware, integrated circuits, firmware, micro-code and the like, operating alone or in combination. The instructions are for implementing the processes, techniques, methods, or acts described herein.

The I/O interface 15 may include any operable connection. An operable connection may be one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels may be used to create an operable connection. For example, the I/O interface 15 may include a first communication interface devoted to sending signals, data, packets, or datagrams and a second communication interface devoted to receiving signals, data, packets, or datagrams. Alternatively, the I/O interface 15 may be implemented using a single communication interface.

Figure 2:
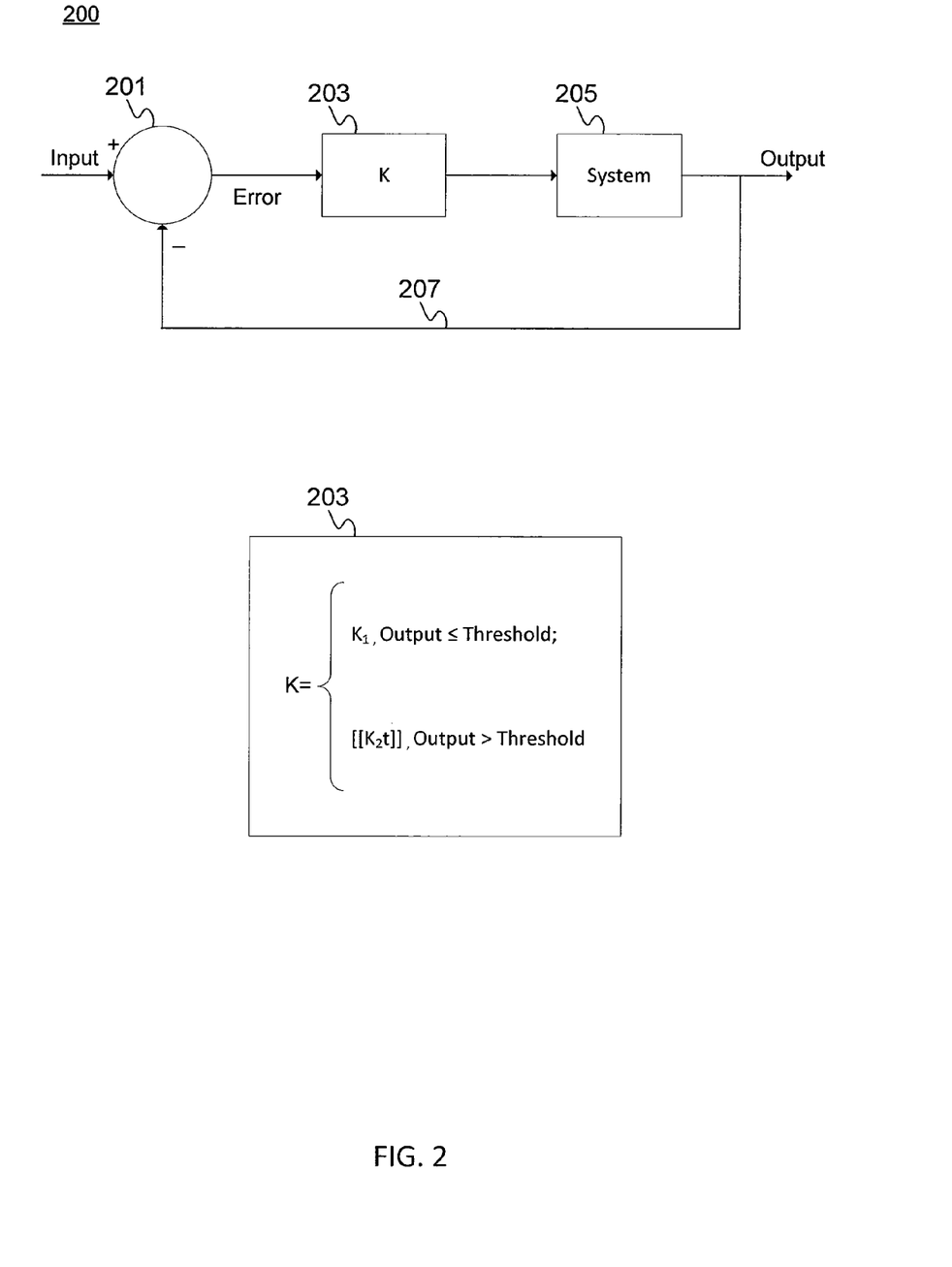
FIG. 2 illustrates an example transfer function for an environmental controller.

FIG. 2 illustrates an example transfer function 200 for the environmental controller 10. The transfer function 200 includes subtraction block 201, dynamic proportion 203, system 205, and feedback 207. The system 205 includes the actual behavior of the fan 19. The transfer function 200 is similar to that of a proportional controller (P controller). A P controller is any feedback control system where the output signal is directly proportional to the error signal. The transfer function 200 is similar to a P controller in that subtraction block 201 calculates an error signal based on the difference between the output, as provided by feedback 207, and the input. The input is the target speed, and may be derived from the control signal.

The dynamic proportion 203 or K is a weight. The dynamic proportion 203 is applied to (multiplied by) the error signal. The dynamic proportion 203 is constant in one mode and variable in another mode. As shown in FIG. 2, the dynamic proportion 203 may be a discrete function of a threshold and time. For example, the dynamic proportion 203 may be a constant $K_1$ while the output is less than or equal to the threshold, and a stair step while the output is greater than the threshold. The double brackets in FIG. 2 illustrate the stair step function. The stair step function may be a second constant $K_2$ multiplied by a time value and truncated or rounded to a multiple of a specified step size. The threshold may be a percentage of the target speed. The percentage may be 80% or 90%, for example.

Alternatively, the dynamic proportion 203 may include other functions. The other functions may be selected from linear, quadratic, logarithmic, or exponential functions. Rather than a function of time, the dynamic proportion 203 may be a function of iterations, samples, or cycles of the control signal or the speed data. For example, the dynamic proportion 203 may increment from one value to the next after a predetermined number of iterations (clock cycles) of the transfer function 200 at a same value. The predetermined number of iterations may be any number, for example 1, 10, 512, 1024, or multiples thereof, and may be selected based on the particular clock signal used by the environmental controller 10.

Instead of the shown proportional controller, the transfer function 200 may be a proportional-integral (PI) controller, including a weighted sum of the error and the integral of the error, or a proportional-integral-derivative (PID) controller, including a weighted sum of the error, an integral of the error, and a derivative of the error.

Figure 3:
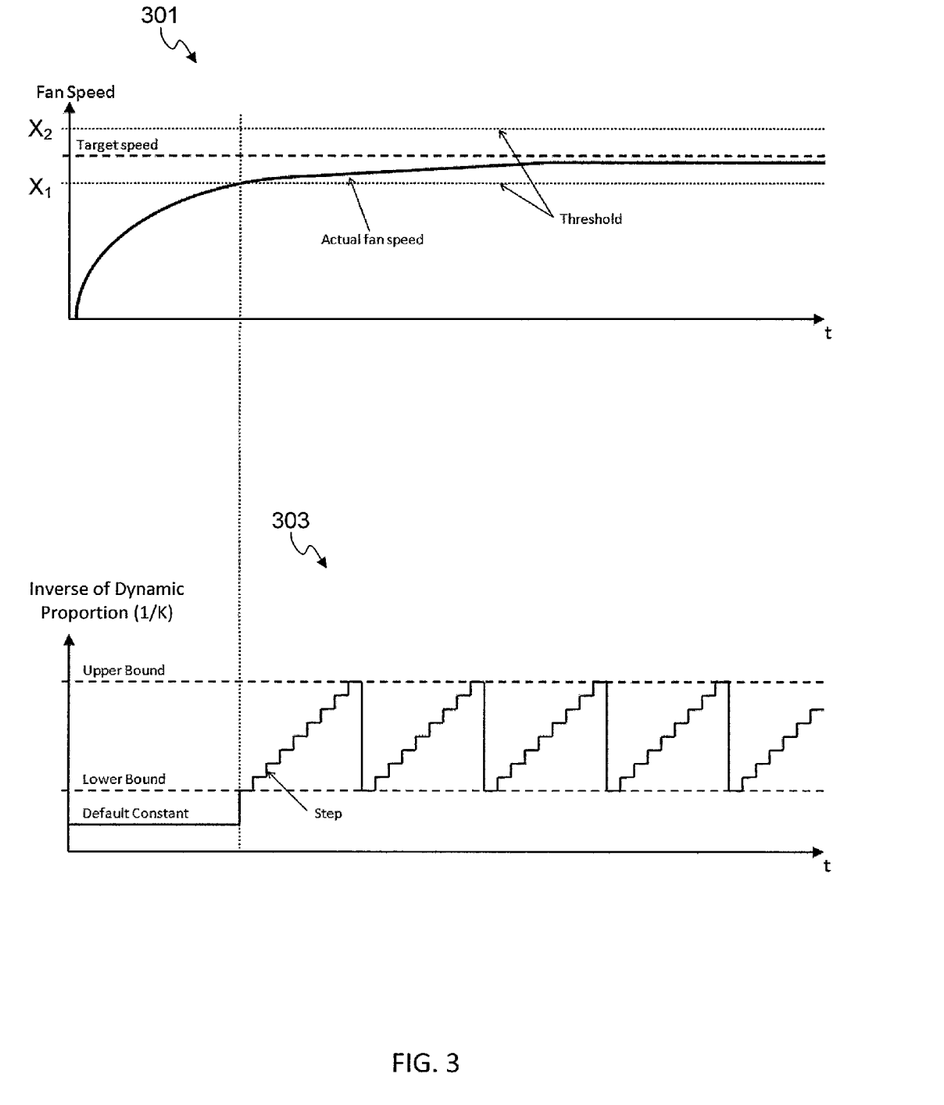
FIG. 3 illustrates an example response and dynamic proportional constant of the transfer function of FIG. 2.

FIG. 3 illustrates an example response graph 301 and dynamic proportion graph 303 of the transfer function 200 of FIG. 2. For illustration purposes, the dynamic proportion graph 303 shows the inverse of the dynamic proportion (1/K). The example response 301 illustrated by a solid line represents the actual speed of fan 19. The dashed line represents the target speed or input to transfer function 200. The dotted line at $X_1$ illustrates a first threshold. When the actual fan speed reaches the first threshold $X_1$, the dynamic proportion 203 is changed.

As shown in dynamic proportion graph 303, the dynamic proportion 203 is constant while the actual fan speed is less than first threshold $X_1$. When the actual fan speed meets or exceeds the first threshold $X_1$, the dynamic proportion 203 becomes a discrete time function. For example, the dynamic proportion 203 may operate as a step function that increments between a lower bound and an upper bound. When the function reaches the upper bound, the function returns to the lower bound. Alternatively, the function may increment from the lower bound to the upper bound and subsequently decrement back to the lower bound.

The above discussion assumes that the actual fan speed is less than the target speed. However, the transfer function 200 may also operate above the target speed. The dotted line at $X_2$ illustrates a second threshold. In one implementation, when the actual fan speed is below the first threshold $X_1$ or above the second threshold $X_2$, the dynamic proportion 203 is constant, and when the actual fan speed is above the first threshold $X_1$ and below the second threshold $X_2$, the dynamic proportion 203 changes according to the discrete time function.

In addition to the equations shown in FIG. 2, the dynamic proportion 203 may be a function of the error. For example, the dynamic proportion 203 may be $K_1$ when the absolute value of the error is greater than an error threshold, and the dynamic proportion 203 may be when the absolute value meets or exceeds the error threshold.

Figure 4:
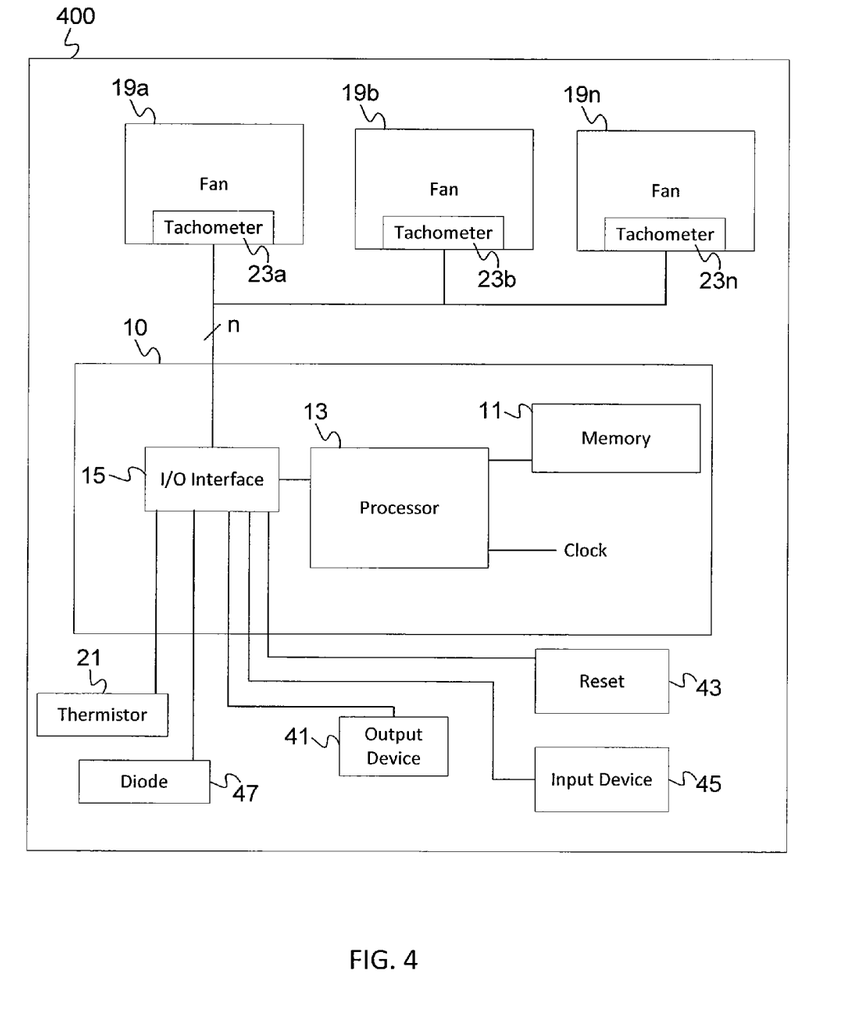
FIG. 4 illustrates a second embodiment of a cooling system.

FIG. 4 illustrates a second embodiment of a cooling system 400. The cooling system 400 includes a plurality of fans 19*a-n*, a plurality of tachometers 23 *a-n*, an environmental controller 10, a thermistor 21, a diode 47, an output device 41, a reset switch 43, and an input device 45. The environmental controller 10 includes an I/O interface 15, a processor 13, a memory 11, a clock signal, which may be generated internally or externally, and a power supply. Like reference numerals and discussion are incorporated from FIG. 2 above. The cooling system 400 may also include one or more heat sinks or heat pipes, which may be mounted directly to, adjacent to, or integrated with any of fans 19*a-n*.

The plurality of fans 19*a-n* may include any number of fans. For example, two, three, or five fans may be included. The plurality of fans 19*a-n* may be any combination of axial fans, curved fans, cross flow fans, or blowers. In some circumstances, the noise produced by the fans 19*a-n* is additive. For example, when the speed of two or more of fans 19*a-n* operate at nearly the same speed and produce nearly the same tone, the perceived noise is higher than when the fans operated at sufficiently different speeds. In addition, the sound produced by fans 19*a-n* may include harmonic frequencies. When any two or more harmonic frequencies overlap in the power spectrum, the cumulative power at that tone is increased, and the cooling system 400 becomes noisier. In addition, one or more of fans 19*a-n* tones, may produce sounds that, at certain speeds, resonate with a frame or chassis of the cooling system 400.

The environmental controller 10 controls the speeds of fans 19*a-n* in order to reduce noise. The target speeds may be selected based on modeling, laboratory experimentation, or simulations. The speeds of fans 19*a-n* may be "tuned" through laboratory experimentation using trial and error to select a set of speeds that produces the least sound or acceptable levels of sound. The set of speeds may be communicated to the environmental controller 10 through the input device 45 and stored in memory 11.

The sets of speeds may be adjusted based on the temperature of the cooling system 400. For example, the set of speeds may include a plurality of speeds for each of fans 19*a-n* that are selected based on the measured temperature at a predetermined point in the cooling system 400, while still providing appropriate air flow. The memory 11 may store up to five or more speeds for fan 19*a* and a corresponding number of temperature ranges. The processor 13 may select one of the speeds based on the temperature near fan 19a. In addition, the processor 13 may use hysteresis to prevent the selected speed from changing too often. For example, the speed changes from a first level to a second level when the temperature is greater than or equal to a first temperature, but the speed does not change from the second level back to the first level until the temperature is less than or equal to a second temperature, which is less than the first temperature.

The thermistor 21 may represent a plurality of thermistors and may be implemented using any type of temperature sensor. A temperature sensor may be associated with each of the plurality of fans 19a-n. Additionally, a plurality of temperature sensors may be associated with each, some or all of the plurality of fans 19a-n. For example, an inlet temperature sensor may be located where outside air is pulled or blown into the cooling system 400, and an outlet temperature senor may be located where air exits the cooling system 400. Airflow measurements or simulations may be used to determine locations for the inlet temperature sensor and/or the outlet temperature sensor. In one implementation, the environmental controller 10 may support two inlet temperature sensors and two outlet temperature sensors. In another implementation, the environmental controller 10 may support one inlet temperature sensor and three outlet temperature sensors. Any combination of temperature sensors is possible.

The cooling system 400 may be in a computer, a set-top box, or a network device. The network device may be a server, a router, a server, a gateway, a switch, or a hub. The cooling system 400 could also operate within an automobile, a heating-ventilating-air conditioning (HVAC) system, or any system that includes motors. A computer, a set-top box, or a network device may also include a central processing unit (CPU) for performing the core computing functions of the device. The CPU may also be configured to implement the functions of environmental controller 10. The CPU in the computer, a set-top box, or a network device may be referred to as the host CPU.

An additional temperature reading may be taken at the CPU using a diode 47 as a temperature sensor. The diode 47 may be an onboard CPU diode that measures the die junction temperature. The diode 47 may be a Shockley diode or a thyristor with a disconnected gate. In order to measure the temperature of the CPU using the diode 47, two different currents are applied to diode 47 and the voltage difference across the diode 47 is used to calculate the temperature of the CPU.

The input device 45 allows a user, administrator, or technician to input commands to the environmental controller 10. The commands may be entered after laboratory testing by a technician. Alternatively or in addition, the commands may be entered during the operation of the cooling system 400 and operation of the apparatus being cooled. The commands may include setting of the plurality of speeds, the plurality of temperatures, the type and parameters of the discrete function, or acceptable sound levels. The commands may be stored in memory 11. The input device 45 may include one or more of buttons, knobs, and dials for tuning the environmental controller 10. Alternatively, the input device 45 may be a keyboard, trackball, touch pad, a mouse, or other user input. Alternatively, the input device 45 may be provided remotely at another terminal by way of a network or the Internet.

In addition, the reset switch 43 may be provided in addition to the input device 45. The reset switch 43 may be electronically connected to the apparatus being cooled. The reset switch 43 may be activated when the apparatus being cooled is powered on or powered off. Alternatively, the reset switch 43 may be activated by the user when the user perceives a malfunction with the cooling system 400.

The output device 41 may be a light emitting diode (LED) or display. The output device 41 may include an indication of power on, standby, or error by different colored lights or by an alphanumeric display. The output device 41 may also display the commands entered by the input device 45 including a setting of any combination of the plurality of speeds, the plurality of temperatures, the type and parameters of the discrete function, or acceptable sound levels.

FIG. 4 illustrates a tachometer 23a-n integrated with each fan 19a-n. Alternatively, the functionality of tachometers 23a-n may be performed by a single tachometer implemented by environmental controller 10. In this case, each fan 19a-n may simply output the sensor signal. In addition or in the alternative to controlling the plurality of fans 19a-n according to a set of speeds and/or temperature, each of the plurality of fans 19a-n may be controlled separately or independently of one another.

Figure 5:
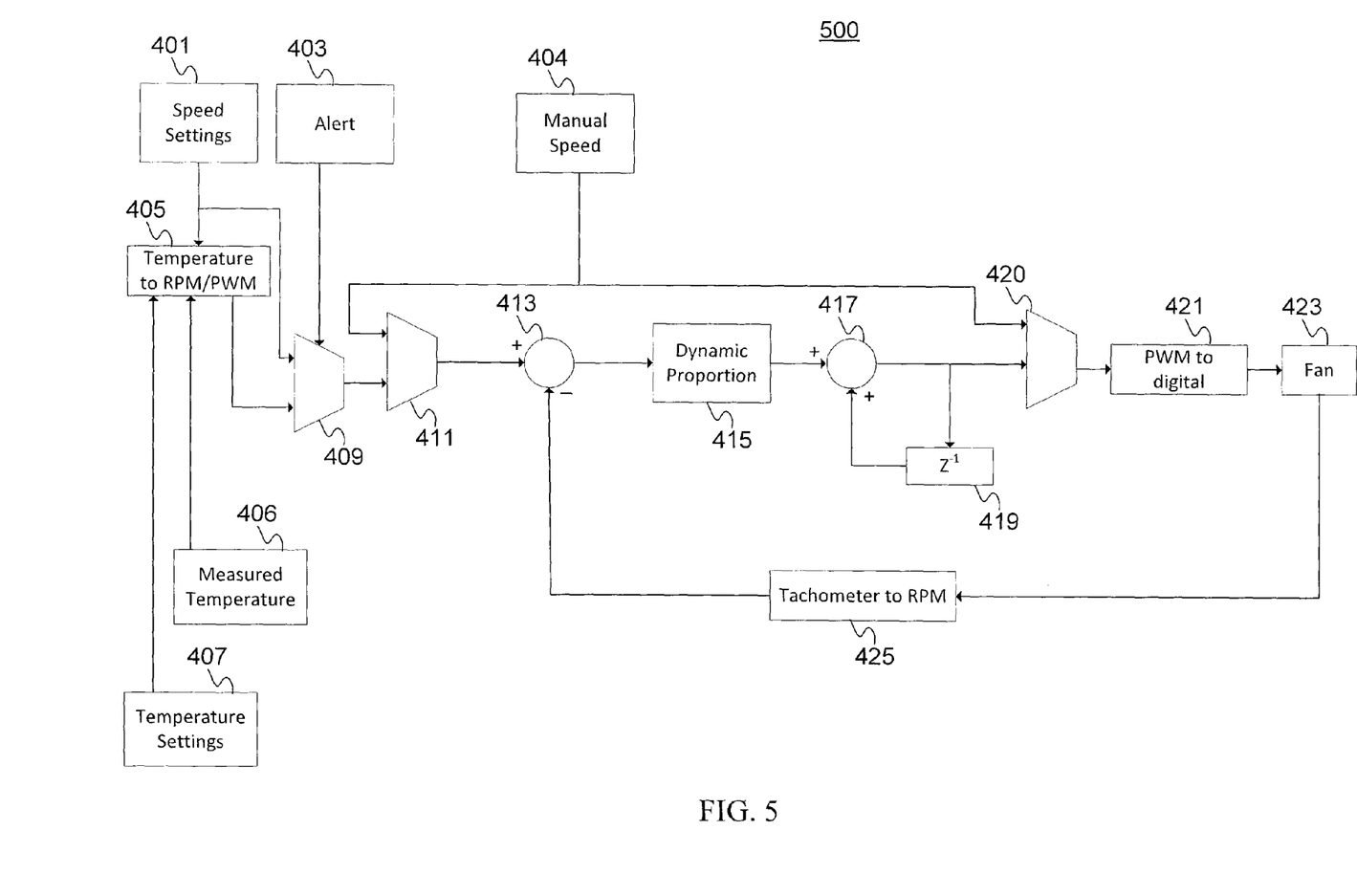
FIG. 5 illustrates a second example transfer function of the environmental controllers of FIGS. 1 and 4.

FIG. 5 illustrates a second example transfer function 500 which may be implemented by the environmental controller 10 of FIGS. 1 and 4. The inputs to the transfer function 500 include the speed settings 401 and temperature settings 407. Depending on the implementation, at least one measured temperature 406 may also be an input. The environmental controller 10, as shown by conversion block 405, calculates the desired speed in revolutions per minute based on the inputs and converts that value to a PWM signal.

Alternatively, conversion block 405 may be bypassed, and the speed settings 401 directly used. For example, multiplexer 409 may enable or disable such a bypass. In addition, the environmental controller 10 may indicate an alert 403 when any of the temperature sensor readings are critically high. The alert 403 triggers a timer, and the fans 19a-n rotate at maximum speed The timeout period allows the host CPU to detect the alert condition in the environmental controller and notify the user. Once the timer expires, the environmental controller 10 may send a shutdown signal to the host CPU, and the system shuts down.

The environmental controller 10 may use a second multiplexer 411 and a third multiplexer 420 to select either the calculated speeds or a manually entered speed 404 to a control loop. The control loop includes a subtraction block 413, a dynamic proportion block 415, an addition block 417, a delay feedback 419, and a feedback and conversion block 425. The output of the multiplexer 411 is converted by the processor 13 to a PWM signal. The dynamic proportion block 415 applies (multiplies) a dynamic proportion to the control signal depending on a threshold value or an error threshold value.

As discussed above, the environmental controller 10 selects a first mode for the control signal if fan speed data indicates an actual speed that is less than the threshold speed. The first mode is based on a constant ($K_1$) and a difference between a target speed and the actual speed. The environmental controller 10 selects a second mode for the control signal if the fan speed data indicates the actual speed is greater than or equal to threshold speed. The second mode is based on a dynamic value ($K_2$) that increments from a lower bound to an upper bound and the difference between the target speed and the actual speed. The dynamic value ($K_2$) may be a function of time or iteration.

In one implementation, addition block 417 and delay feedback 419 provide one or more unit delays for the purpose of aligning the control signal with the measured speed. The processor 13 may also make a conversion at conversion block 421 from the internal digital value to a PWM signal as input to the fan 423. The tachometer 23 measures the actual speed of fan 423, which is converted to RPM at block 425 and returned to subtraction block 413. At subtraction block 413, the processor 13 calculates the error signal as a difference between the input signal (target speed) and the actual speed received from block 425.

Figure 6:
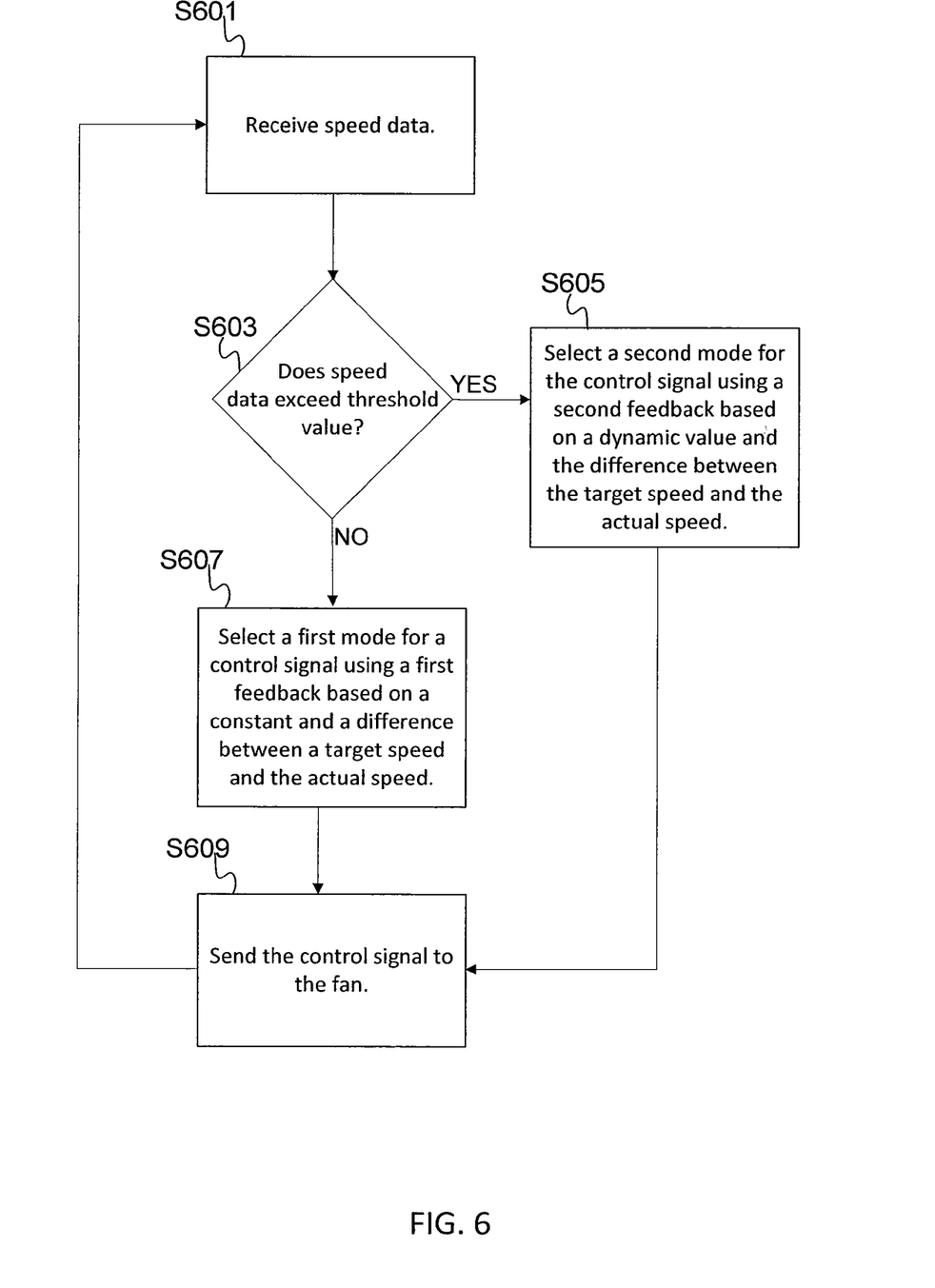
FIG. 6 illustrates an embodiment of a flow chart for fan speed control.

FIG. 6 illustrates an embodiment of a flow chart for fan speed control. At S601, the environmental controller 10 receives speed data from at least fan 19*a-n*. The speed data may already be in a format that indicates the RPM of the fan motor. Alternatively, the speed data may be in a raw sensor format, and the environmental controller 10 converts the raw sensor format to RPM. The environmental controller 10 may also do a preliminary check to determine if one or more of the fans 19*a-n* is currently running by receiving the speed data.

At S603, the environmental controller 10 determines whether the speed data indicates a speed that is above a threshold value. The threshold value may be stored in memory 11. The threshold value may be constant or the threshold value may be a fraction of a target speed. The target speed may be entered by the user or developer, or the target speed may be calculated by the processor 13 based on a variety of factors. The factors may include temperature readings, geometry of the host device that includes the cooling system, materials, acoustics, measured sound from a microphone, a number of fans, locations of fans, or any combination thereof.

At S607, the environmental controller 10 selects a first mode (constant proportional control) for a control signal. In the first mode, a constant and a difference between the target speed and the measured (actual) speed are used to control the fan speed. At S605, the environmental controller 10 selects a second mode (dynamic proportional control) for the control signal. In the second mode, a dynamic value and the difference between the target speed and the actual speed are used to control the fan speed. In one implementation, the control signal is a PWM signal. In another implementation, the control signal is the power signal that is varied to control the fan speed. The dynamic value may be a function of time or a function of the number of iterations since the speed data exceeded the threshold value. At S609, the environmental controller sends the control signal to the fan motor. The control signal applies a control effort to the system of the fan motor. The control effort may be an increase in speed or a decrease in speed.

Various embodiments described herein can be used alone or in combination with one another. The foregoing detailed description has described only a few of the many possible implementations of the present invention. For this reason, this detailed description is intended by way of illustration, and not by way of limitation.

We claim:

1. A method comprising:
   receiving, as an input, speed data from a fan;
   comparing the speed data to a threshold speed;
   selecting a first mode for a control signal when the speed data indicates an actual speed that is less than the threshold speed, wherein the first mode includes a constant weight applied to a difference between a target speed and the actual speed;
   selecting a second mode for the control signal when the speed data indicates the actual speed is greater than the threshold speed, wherein:
   the second mode comprises a dynamic weight applied to the difference between the target speed and the actual speed,
   the dynamic weight increments according to a periodic step function from a predetermined lower bound on the dynamic weight to a predetermined upper bound on the dynamic weight; and
   the dynamic weight decreases towards the predetermined lower bound, greater than the constant weight, after incrementing towards the upper bound; and
   sending the control signal to the fan.

2. The method of claim 1, further comprising:
   selecting the target speed based on temperature data from at least one temperature sensor.

3. The method of claim 1, further comprising:
   selecting the target speed to avoid a beat frequency identified through modeling, simulation, or experimentation.

4. The method of claim 3, wherein a plurality of fans contributes to the beat frequency, wherein the plurality of fans includes the fan.

5. The method of claim 1, wherein the dynamic value increments based on a predetermined number of samples of the speed data.

6. The method of claim 1, wherein the control signal is a pulse width modulated signal, wherein widths of pulses in a train of on-off pulses determines a level of power applied to the fan.

7. The method of claim 1, wherein a step size incremented by the dynamic weight is variable and selected by a first input; and wherein a step time period of the dynamic weight is variable and selected by a second input.

8. The method of claim 1, wherein the threshold speed is a first threshold speed, the method further comprising:
   selecting the first mode for a control signal if the speed data indicates the actual speed is greater than a second threshold speed; and
   selecting the second mode for the control signal if the speed data indicates the actual speed is less than or equal to the second threshold speed,
   wherein the second threshold speed is greater than the first threshold speed and greater than the target speed.

9. An apparatus comprising:
   an interface configured to receive speed data and transmit a control signal;
   a memory configured to store a threshold value and a target value; and
   a processor configured to calculate an input comprising a difference value between the speed data and the threshold value and generate the control signal based on the input difference value and the target value,
   wherein when the input difference value is greater than the threshold value, the control signal includes a constant proportion applied to the input difference value and when the input difference value is less than the threshold value, the control signal includes a varying proportion applied to the input difference value, the varying proportion incrementing according to a periodic oscillating function from a lower bound greater than the constant proportion towards an upper bound and then returning towards the lower bound, based on a predetermined time period or a predetermined number of cycles of the control signal.

10. The apparatus of claim 9, further comprising: a tachometer configured to calculate the speed data.

11. The apparatus of claim 9, further comprising:
   a diode associated with a host device, wherein the processor calculates a temperature of the host device based on the performance of the diode.

12. The apparatus of claim 9, further comprising:
an output device configured to indicate the target value or the speed data.

13. The apparatus of claim 9, further comprising:
a plurality of fans including at least a first fan and a second fan; a plurality of temperature sensors including at least a first temperature sensor associated with the first fan and a second temperature sensor associated with the second fan, wherein the control signal controls a speed of the first fan, and wherein the processor is configured to calculate the target value based on the first temperature sensor and the second temperature sensor.

14. The apparatus of claim 9, wherein the periodic function is a periodic stair-step function.

15. The apparatus of claim 14, wherein a step size incremented by the dynamic weight is variable and selected by a first input; and wherein a step time period of the dynamic weight is variable and selected by a second input.

16. One or more non-transitory tangible media having logic encoded thereon, the logic executable by a processor and operable to:
calculate an input comprising an error value as a difference between fan speed data and a target speed;
compare the input error value to an error threshold; and
control fan speed by applying a constant proportion to the input error value where the input error value is greater than the error threshold and by applying a dynamic proportion to the input error value where the input error value is less than the error threshold, and where the dynamic proportion increments according to a periodic stair-step function from a lower bound on the dynamic proportion towards an upper bound on the dynamic proportion, and returns towards the lower bound that comprises a value greater than the constant proportion.

17. The one or more non-transitory tangible media of claim 16, the logic further operable to:
select the target speed based on temperature data from at least one temperature sensor.

18. The one or more non-transitory tangible media of claim 16, wherein the control signal is a pulse width modulated signal, wherein a pulse width of the pulse width modulated signal determines a level of power applied to a fan motor.

19. The one or more non-transitory tangible media of claim 16, the logic further operable to:
receive fan speed data from a plurality of fans; and
select the target speed based on the fan speed data from the plurality of fans.

* * * * *